(12) United States Patent
Son et al.

(10) Patent No.: US 6,434,052 B1
(45) Date of Patent: Aug. 13, 2002

(54) NONVOLATILE MEMORY DEVICES HAVING ALTERNATIVE PROGRAMMING

(75) Inventors: Jong-Chang Son; Jong-Min Park, both of Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/222,044

(22) Filed: May 3, 1999

(30) Foreign Application Priority Data

Dec. 31, 1997 (KR) .......................................... 97-81000

(51) Int. Cl.$^7$ ............................................... G11C 16/06

(52) U.S. Cl. .............................. 365/185.23; 365/230.06

(58) Field of Search ....................... 365/185.23, 230.01, 365/230.06, 230.08, 238.5

(56) References Cited

U.S. PATENT DOCUMENTS 5,898,637 A * 4/1999 Lakani et al. .......... 365/230.06
5,959,897 A * 9/1999 Chevallier et al. ..... 365/185.33

\* cited by examiner

*Primary Examiner*—David Nelms
*Assistant Examiner*—Thong Le
(74) *Attorney, Agent, or Firm*—Marger Johnson & McCollom, P.C.

(57) ABSTRACT

The disclosure is a nonvolatile memory device operable in a plurality of programming cycles, including, a memory cell array formed of a plurality of memory cells connected to bit lines and word lines, a plurality of data buffers for receiving a plurality of data bits, a plurality of write drive circuits disposed between the memory cell array and the data buffers, and a circuit for generating a plurality of selection signals for controlling the write drive circuits, in response to a current level of a power supply voltage. The selection signals determines the number of data bits programmed in one of the programming cycles.

9 Claims, 10 Drawing Sheets

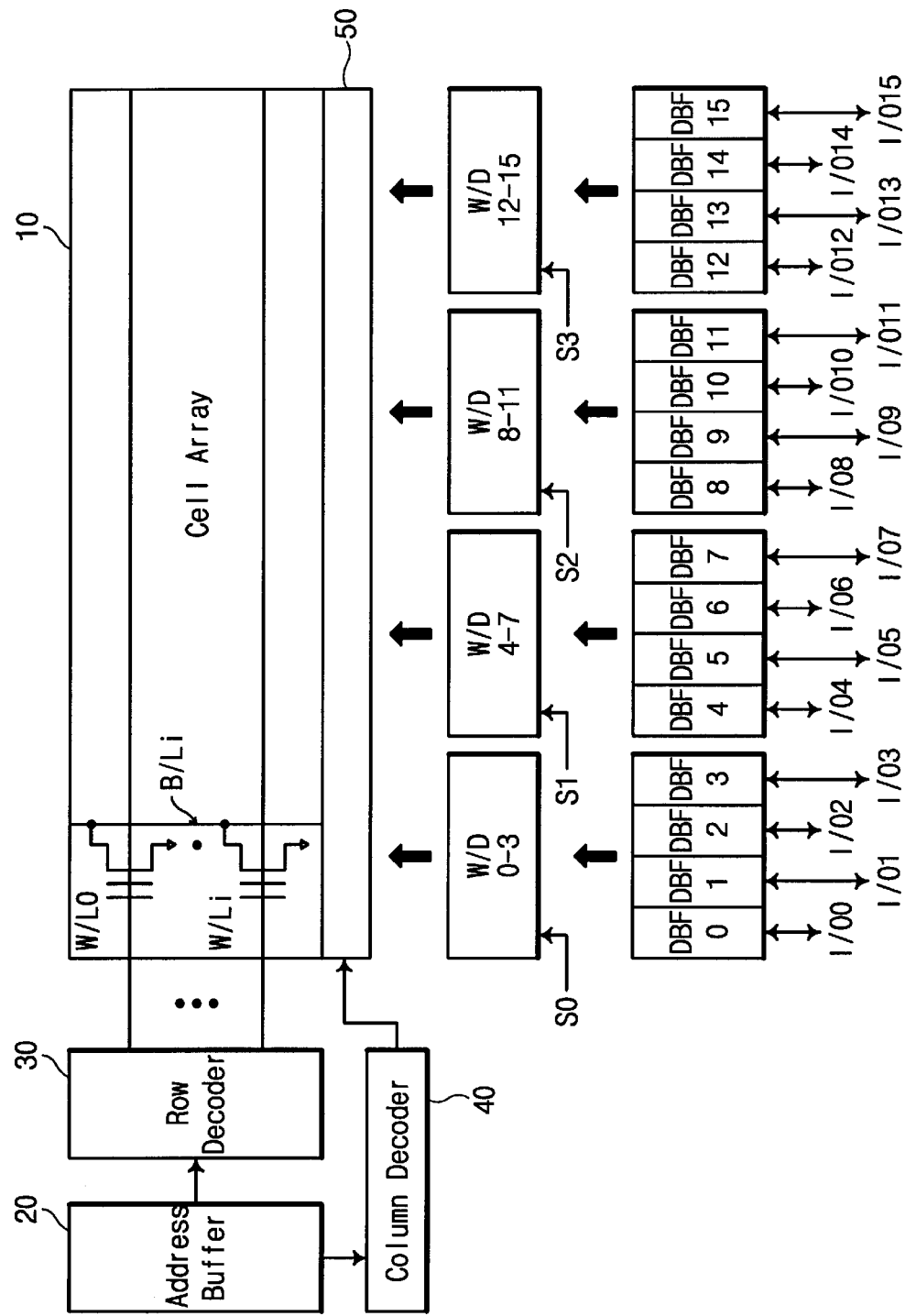

Fig. 7A
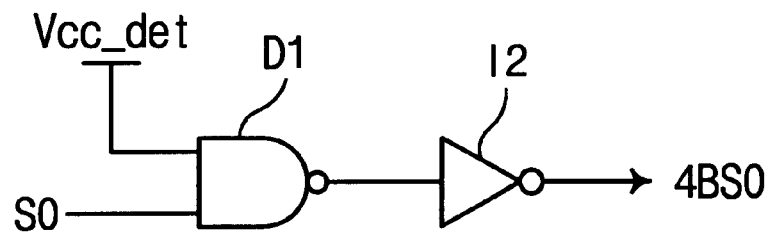
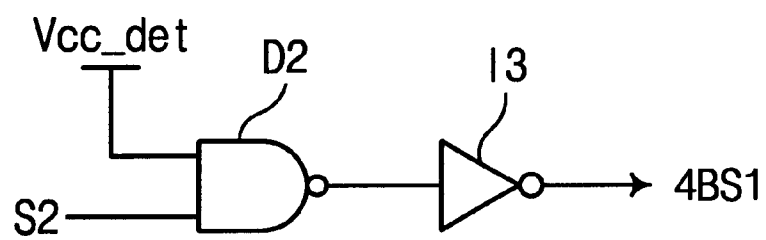
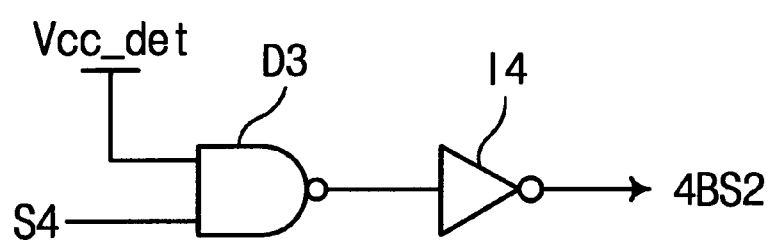
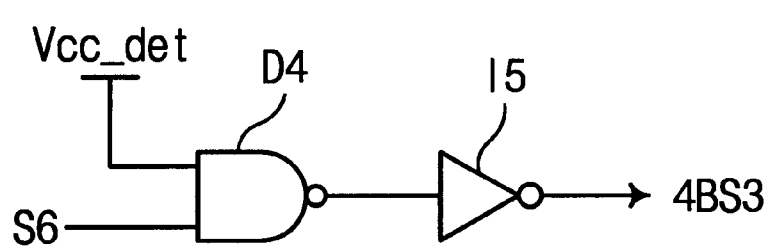

NONVOLATILE MEMORY DEVICES HAVING ALTERNATIVE PROGRAMMING

FIELD OF THE INVENTION

The present invention relates to nonvolatile semiconductor memory devices, and more particularly to a nonvolatile semiconductor memories having a programming operation.

BACKGROUND OF THE INVENTION

Flash memories have advanced performances in accessing data, than any other kind of nonvolatile memories such as electrically erasable and programmable read only memories, for a reading and writing (or programming). The merit of high speed operation in the flash memory has been regarded to be very adaptable to portable computing apparatuses, cellular phones or digital still cameras. In general, there are two kinds of the flash memory, such as the NAND-type in which memory cells are connected from a bit line in serial, and the NOR-type in which memory cells are connected to a bit line in parallel. It is well known that the NOR-type flash memory has a competitive speed for data accessing, which makes the NOR-type be more advantageous in a high frequency memory system than the NAND-type.

Typical construction of the cell (or cell transistor) of the flash memory is shown in FIG. 1, which can be used for the multi-bit storage. Source 3 and drain 4, each being formed of N+diffused region in P+semiconductor substrate 2, are separated each other through a channel region which is also defined in substrate 2. Floating gate 6 is formed over the channel region through thin insulating film 7 which is under 100A, and insulating film 9, such as an O—N—O (Oxide-Nitride-Oxide) film, on floating gate 6 isolates control gate 8 from floating gate 6. Source 3, drain 4, control gate 8 and substrate 2 are each connected to their corresponding voltage sources Vs (drain voltage), Vd (source voltage), Vg (gate voltage) and Vb (bulk voltage), for programming, erasing and reading operations.

In programming, as well known, a selected memory cell is programmed by means of a hot electron injection between the channel region and floating gate, in which the source and substrate are held in a ground voltage, a high voltage (e.g., Vg=10V) is applied to the control gate and a voltage to induce the hot electrons therein, 5V through 6V, is provided to the drain. After programmed, a threshold voltage of the selected memory cell is increased therefrom due to deposition of electrons. To read data from the programmed cell, a voltage of about 1V is applied to the drain, a power source voltage (or about 4.5V) is applied to the control gate, and the source is held in the ground voltage. Since the increased threshold voltage of the programmed memory cell acts as an blocking potential even upon the gate voltage during a read-out operation, the programmed cell is considered to as an off-cell which has a threshold voltage between 6V and 7V.

Erasing a memory cell is accomplished by conducting F-N (Fowler-Nordheim) tunneling effect, in which the control gate is coupled to a high negative voltage of about −10V, and the substrate (or bulk) to a positive voltage of about 5V, in order to induce the tunneling therebetween. While this, the drain is conditioned at a high impedance state (or a floating state). A strong electric field induced by the voltage bias conditions, between the control gate and bulk region, causes the electrons to be moved into the source. The F-N tunneling normally occurs when the electric field of 6~7 MV/cm is developed between the floating gate and bulk region which are separated through the thin insulating film under 100A. The erased cell has a lower threshold voltage than before, and thereby sensed as an on-cell which has a threshold voltage between 1~3V.

In an usual architecture of a memory cell array in a flash memory, the bulk region (or the substrate) combines active regions of memory cells, so that memory cells formed in the same bulk region are spontaneously erased in the same time. Therefore, units of erasing (hereinafter referred to as "sector", for instance, one sector of 64K) is determined in accordance with the number of separating the bulk regions. Table 1 shows levels of the voltages used in programming, erasing and reading.

TABLE 1

| operation mode | Vg | Vd | Vs | Vb |
|---|---|---|---|---|
| programming | 10 V | 5~6 V | 0 V | 0 V |
| erasing | −10 V | floating | floating | 5 V |
| reading | 4.5 V | 1 V | 0 V | 0 V |

In the bias condition shown in FIG. 2A, current about 400 $\mu$A flows from the drain terminal, being connected to about 5V, to the source terminal held in 0V. Hot electrons are stacked in floating gate 6, penetrating through tunnel oxide layer 7 interposed between floating gate 6 and the channel region. The large current of 400 $\mu$A approximately per cell transistor makes it to be considered that a great number of bits may not be available to be programmed in one time. Usually, almost all of the flash memories employ the programming manner which deal with a unit of byte or word. Programming by a byte (1 byte=8 bits) consumes about 3.2 $\mu$A (400 $\mu$A×8) per byte, and programming by a word may consume about 6.4 $\mu$A (400 $\mu$A×16) per word.

In programming either by a byte or by a word, a number of charge pump circuits are necessary to make the 5V that is bootstrapped from a power supply voltage, increasing the area for lay-out and current consumption. The burden upon programming with increasing circuit area and current dissipation has been issued by an article disclosed in 1996VLSI Circuits by AMD, entitled A 2.7V Only 8Mbx16 NOR Flash Memory in which 1-word is programmed by four bits in four cycle times.

A typical construction of a flash memory device includes, as shown in FIG. 3, memory cell array 10, address buffer 20, row decoder 30, column decoder 40, Y-pass gate circuit 50, data input/output buffers DBF0–DBF15 corresponding to data input/output lines I/O0–I/O15, and write drive circuits W/D0–3 through W/D12–15 which are assigned to bit line selection signals S0–S3. Memory cell array 10 has word lines arranged in a column direction and bit lines, intersecting the word lines, arranged in a row direction. The bit lines are connected to Y-pass gate circuit 50 which selects the bit lines by using decoded signals provided from the column decoder and causes the bit lines to be activated in response to a supply of bit line drive signals into the write drive circuits according to the selection signals.

In a programming operation of the device, input data bits of 16 are first stored in the data buffers DBFi by four bits. In order to program with the unit of four bits, it is necessary to select four bit lines in one time, and the selection signals S0–S3 are applied to their corresponding write drive circuits with the same values. Referring to FIG. 4, the selection signals S0–S3 are enabled in sequence and thereby programming for 1-word is conductive with the unit of four bits throughout four cycle times.

Considering there has been increased of the needs for normal operations conductive even in the basis of a lower power supply voltage as well as an external power supply voltage, programming, erasing and reading must be successfully performed in the condition of a lower Vcc or an wider range (e.g., 2–4V) of voltage. However, since the device aforementioned produces the 5V, to be used in programming with a lower Vcc, by means of charge pump circuits embedded therein, the time for generating the 5V becomes longer. And, even though it is possible to carry out programming in the condition of an wider voltage range by dividing the number of bits that is available to be programmed in one time, it is inevitable to increase the number of cycle times for programming. Furthermore, programming with a high voltage relative to the lower Vcc causes current consumption to be increased more and more every when programming is conductive.

SUMMARY OF THE INVENTION

The present invention is intended to solve the problems. And, it is an object of the invention to provide a nonvolatile memory for performing an optimized program operation free from a level of a power supply voltage.

In order to accomplish those objects, a nonvolatile memory device of the invention, operable in a plurality of programming cycles, includes, a memory cell array formed of a plurality of memory cells connected to bit lines and word lines, a plurality of data buffers for receiving a plurality of data bits, a plurality of write drive circuits disposed between the memory cell array and the data buffers, and a circuit for generating a plurality of selection signals for controlling the write drive circuits, in response to a current level of a power supply voltage. The selection signals determines the number of data bits programmed in one of the programming cycles.

BRIEF DESCRIPTION OF THE DRAWINGS

For a better understanding of the invention, and to show how embodiments of the same may be carried into effect, reference will now be made, by way of example, to the accompanying diagrammatic drawings, in which:

FIG. 3 shows a construction of a conventional flash memory device;

FIGS. 7A and 7B show the selection control circuit and selection circuit, respectively, of FIG. 5;

In the figures, like reference numerals denote like or corresponding parts, and a signal name accompanying prefix "n" operates in negative logic.

DETAILED DESCRIPTION OF THE PREFERRED EMBODIMENTS

Hereinbelow, applicable embodiments of the invention will be as follows, with the appended drawings.

Figure 1:
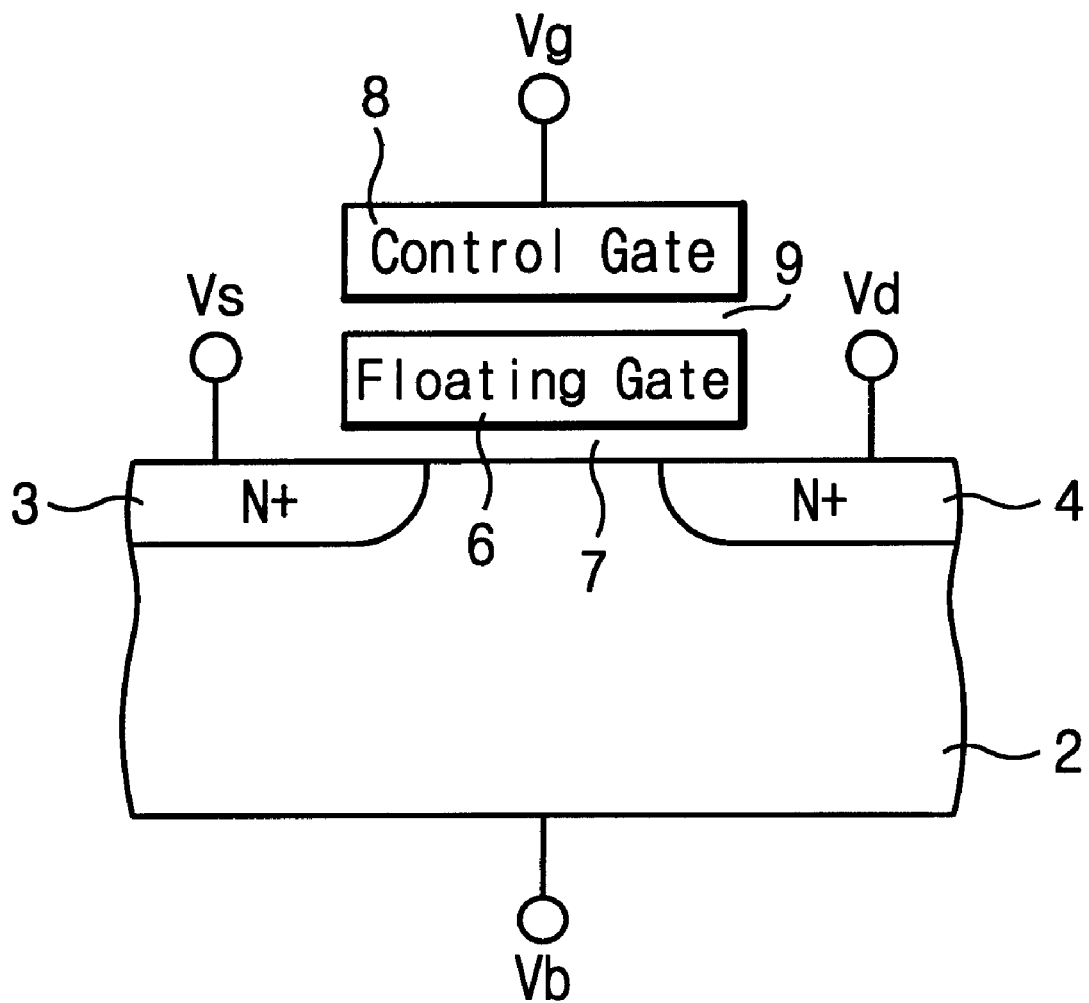
FIG. 1 shows a vertical structure of a flash electrically erasable and programmable memory cell.
Figure 2A:
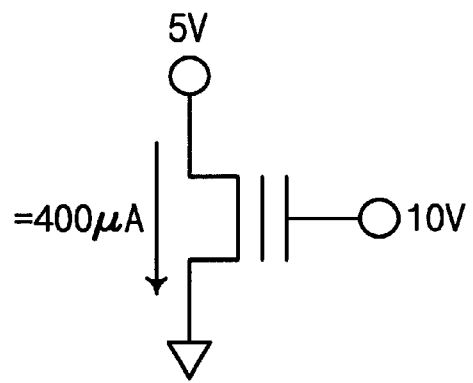
FIGS. 2A and 2B are schematics illustrating the state of a flash memory cell to which program voltage is applied.
Figure 2B:
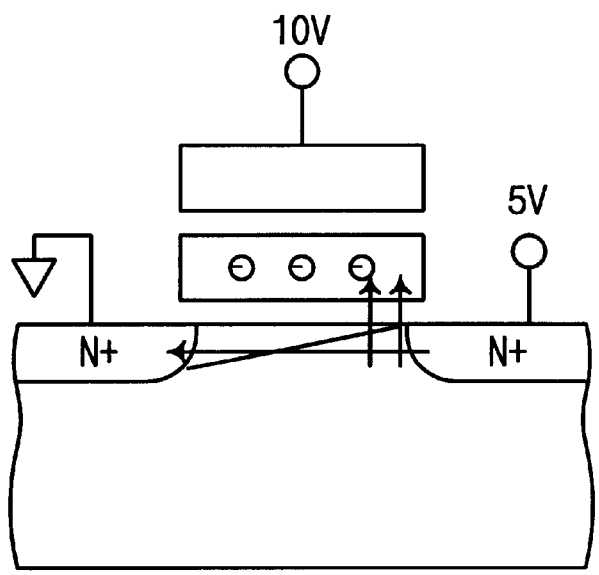
Figure 4:
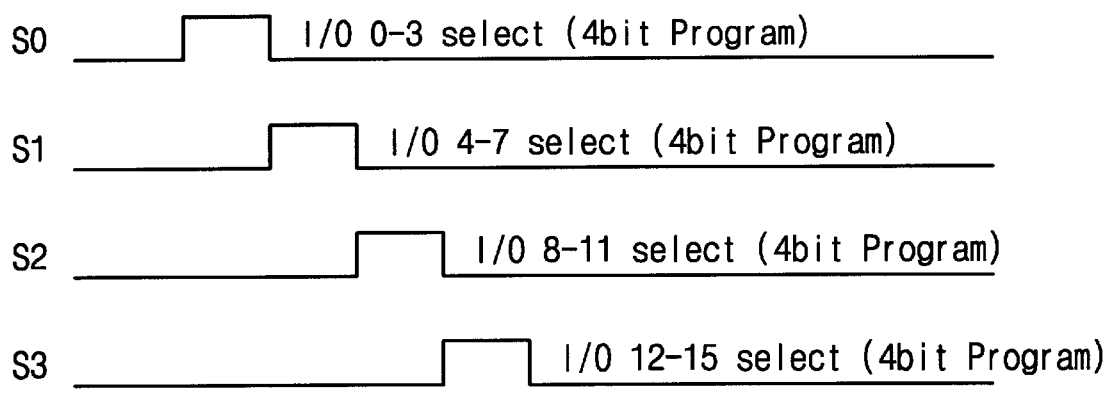
FIG. 4 shows wave forms of selection signals while programming in FIG. 3.
Figure 5:
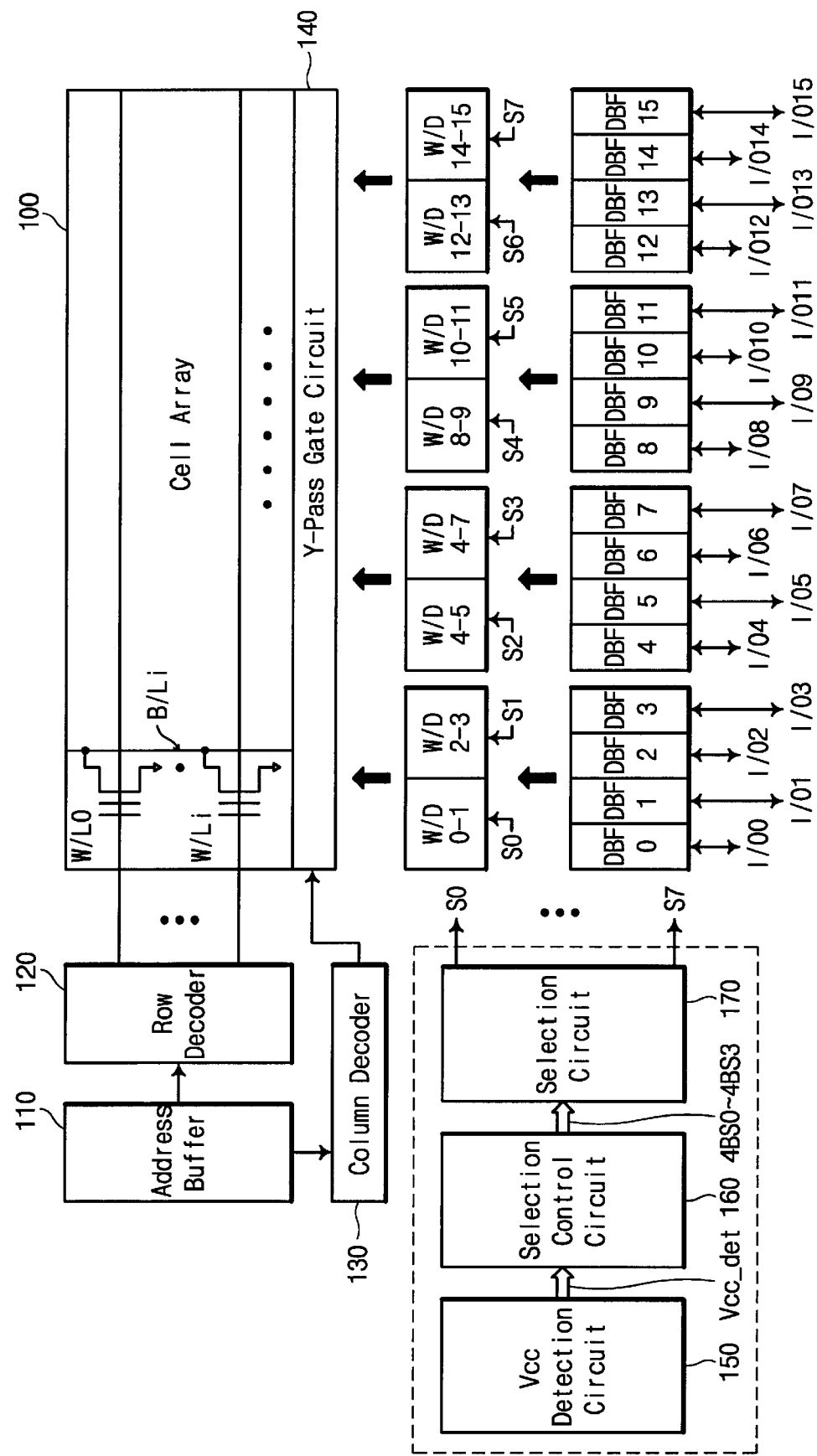
FIG. 5 shows a construction of a flash memory device according to the invention.

Referring to FIG. 5, the flash memory includes memory cell array 100, adders buffer 110, row decoder 120, column decoder 130, Y-pass gate circuit 140, power supply voltage (Vcc) detection circuit 150, selection control circuit 160, data buffers DBF0–DBF15 and write drive circuits W/D0–WD15. In memory cell array 100, word lines and bit lines are arranged in a matrix, and cell transistors are connected between the bit lines and the ground voltage, gates of the cell transistors being coupled to the word lines, which is called a NOR-type cell array. Address buffer 20 receives external address signals and generates address signals for selecting the word lines and bit lines. Row decoder 120 decodes the address signals provided from address buffer 20 to select the word lines, and column decoder 130 decodes the address signals provided from address buffer 110 to select the bit lines. Y-pass gate circuit 140 selects the bit lines in response to the decoded signals generated from column decoder 130. Vcc detection circuit 150 generates detection signal Vcc_det which is made from comparing an external Vcc with a reference voltage. Vcc_det is applied to selection control circuit 160. Selection drive circuit 160 generates selection control signals 4BS0 through 4BS3 which causes selection signals S0 through S7 to be generated from selection circuit 170. Data buffers DBF0 through DBF15 are divided in to four groups, each group being composed of four data buffers, corresponding to four sets of input/output lines. Input data stored in the data buffers are transferred to four sets of write drive circuits, each set being formed of four write drive circuits. The write drive circuits applies the data to the bit lines through Y-pass gate circuit 140 in response to the selection signals S0–S7 supplied from the selection circuit 170. Each of the selection signals is designed to control two write drive circuits.

Figure 6:
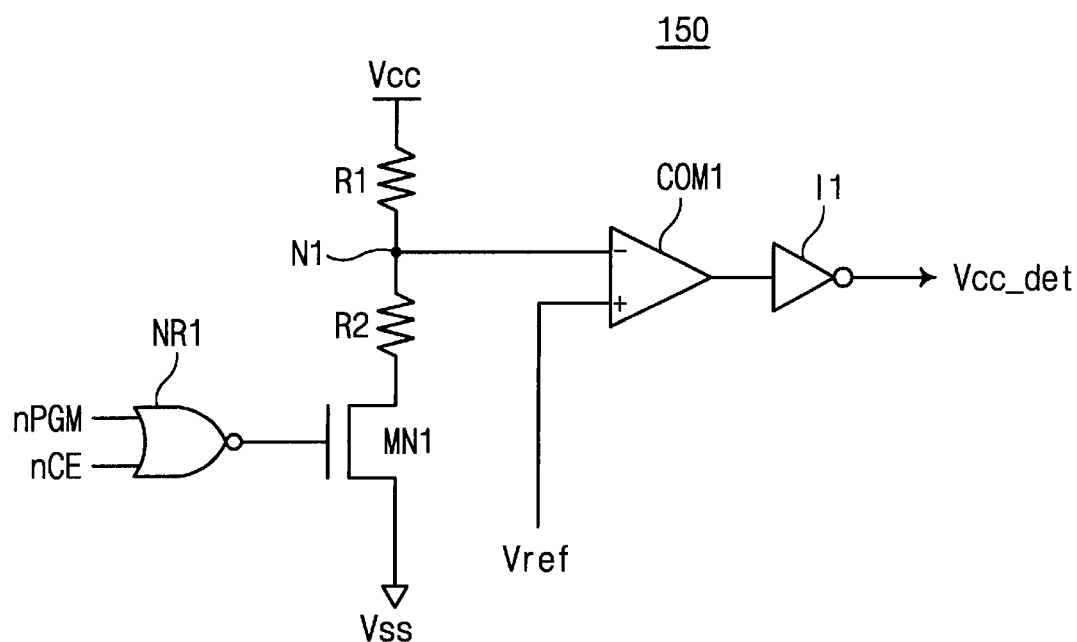
FIG. 6 shows the Vcc detecting circuit of FIG. 5.

Vcc detection circuit 150, referring to FIG. 6, receives program enable signal nPGM and chip enable signal nCE through NOR gate NR1. Output of NOR gate NR1 is coupled to gate of NMOS transistor MN1 which is connected between resistor R2 and substrate voltage Vss (or the ground voltage). The other end of resistor R2, node N1 is connected to Vcc through resistor R1. Node N1 is also arranged to be one input of comparator COM1. The other input of comparator COM1 is connected to reference voltage Vref. Output of comparator COM1 becomes the detection signal Vcc_det through inverter I1. The voltage level at node N1 directly responds to variation of Vcc. The divided voltage at node N1 can be established therein when nPGM and nCE are laid on low levels as their activation states. Vcc_det goes to high level when the voltage of N1 is higher than Vref, and goes to low level when the voltage of N1 is lower than Vref.

Figure 7B:
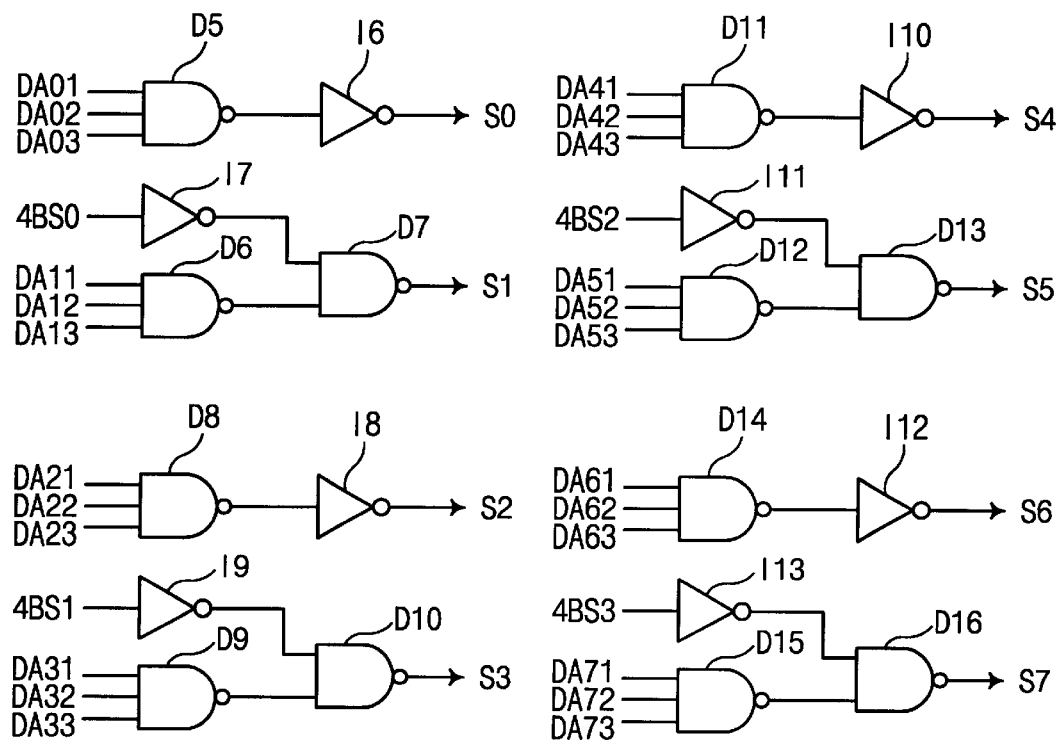

Referring to FIG. 7A, the selection control circuit 160 has NAND gates D1–D4 which each receive even-numbered selection signals S0, S2, S4 and S6. One input of each of NAND gates D1–D4 coupled to Vcc_det generated from Vcc detection circuit 150. Outputs of NAND gates D1–D4 becomes selection control signals 4BS0–4BS3 through inverters I2–I5, respectively. The selection circuits, referring to FIG. 7B, includes NAND gates D5, D8, D11 and D14 and inverters I6, I8, I10 and I12 which are serially connected to the NAND gates, for generating even-numbered selection signals S0, S2, S4 and S6. Selection control signals 4BS0–4BS3 are applied to NAND gates D7, D10, D13 and D15 through inverters I7, I9, I11 and I13, respectively, together with outputs of NAND gates D6, D9, D12 and D15. NAND gates D7, D10, D13 and D16 generates odd-numbered selection signals S1, S3, S5 and S7. The NAND gates D5, D6, D8, D9, D11, D12, D14 a receive their corresponding decoding signals DA01–DA03, DA11–DA13, DA21–DA23, DA31–DA33, DA41–DA43, DA51–DA53, DA61–DA63 and DA71–DA73, respectively, provided from the column decoder.

Figure 8:
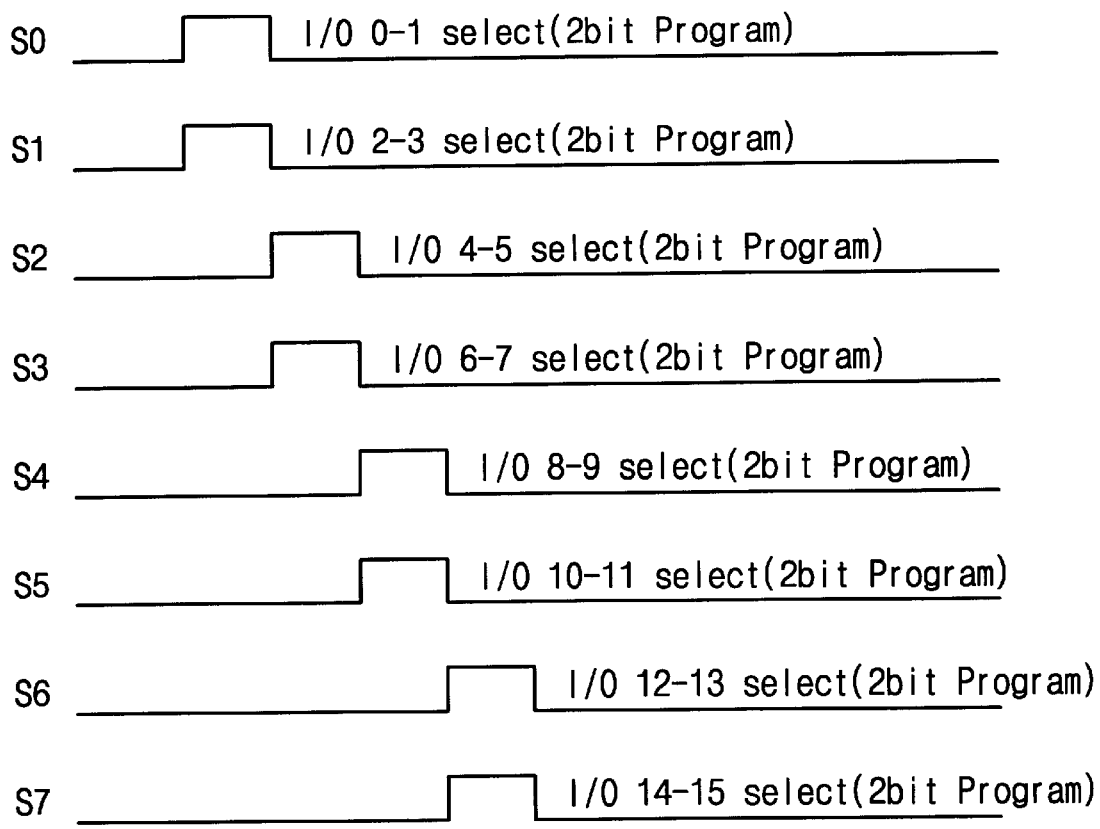
FIG. 8 shows wave forms of selection signals during a program mode when Vcc is higher than 2.5V.
Figure 9:
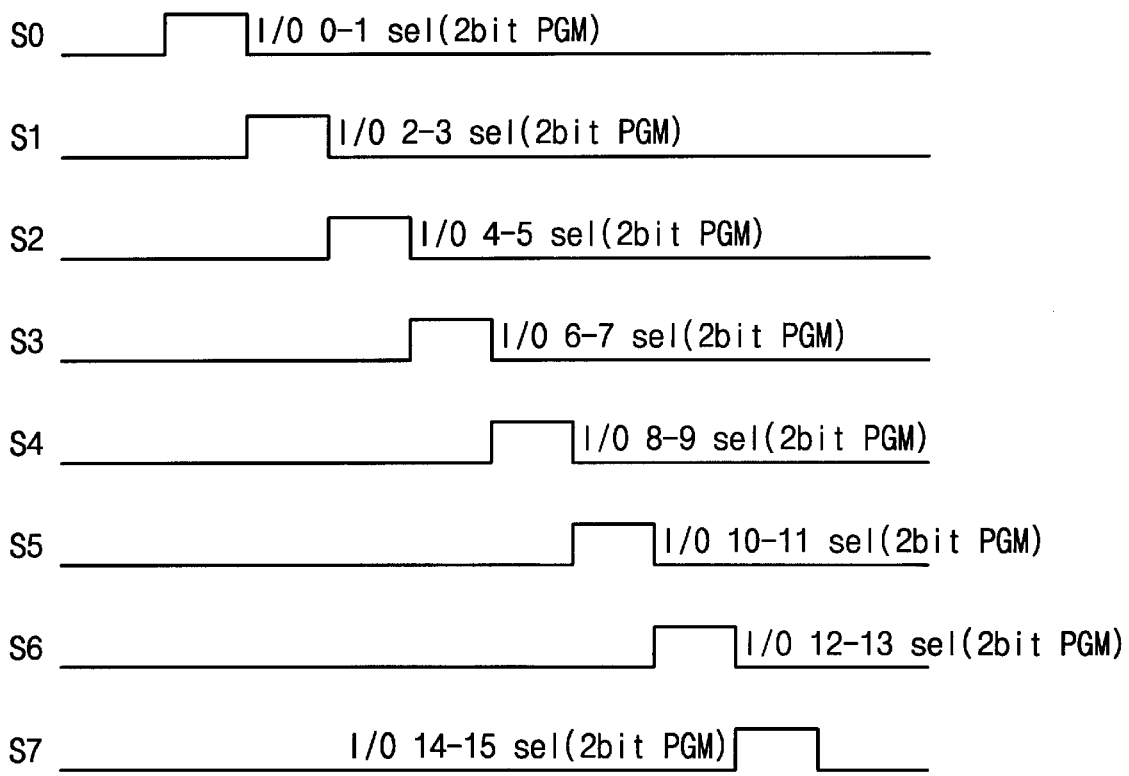
FIG. 9 shows wave forms of selection signals during a program mode when Vcc is lower than 2.5V.

FIGS. 8 and 9 show the states of the selection signals when Vcc is higher or lower than 2.5V, respectively, when the predetermined voltage level of Vcc is 2.5V. First, if Vcc is higher than 2.5V, Vcc_det is high level and selection control signals 4BS0–4BS3 are dependent upon logic states of the even-numbered selection signals S0, S2, S4 and S6. S0 is enabled in the first programming cycle, 4BS0 becomes high level while other selection control signals are held in low levels. 4BS0 of high level causes S1 to be high level in FIG. 7B. As both S0 and S1 are high levels, write drive circuits W/D0 through W/D3 are conductive and thereby data of four bits, provided from data buffers DBF0–DBF3, are accessed into corresponding bit lines through the four write drive circuits W/D0–W/D3. Next, in the second programming cycle, S2 is enabled to be high level that makes S3 high level. As S2 and S3 are all high levels, write drive circuits W/D4 through W/D7 are conductive and thereby data of four bits, provided from data buffers DBF4–DBF7, are accessed into corresponding bit lines through the four write drive circuits W/D4–W/D7. In the third programming cycle, S4 of high level makes S5 be high level and thereby write drive circuits W/D8 through W/D11 are conductive and thereby data of four bits, provided from data buffers DBF8–DBF11, are accessed into corresponding bit lines through the four write drive circuits W/D8–W/D11. In the fourth programming cycle, since S6 and S7 become high levels in the same manner aforementioned, write drive circuits W/D12 through W/D15 consisting the fourth set are operable and thereby data of four bits, provided from data buffers DBF12–DBF15, are accessed into corresponding bit lines through the four write drive circuits W/D12–W/D15.

If Vcc is lower than 2.5V, referring to FIG. 9, Vcc_det goes to low level and thereby the selection control signals 4BS0–4BS3 are all set in low levels. Thus, selection signals from S0 to S7 are activated in sequence as shown in FIG. 9, according to their corresponding decoding inputs. As each of the selection signals is assigned to two write drive circuits, in the first programming cycle, S0 of high level makes write drive circuits W/D0 and W/D1 transfer two data bits, provided from data buffers DBF0 and DBF1, to their corresponding bit lines of two bits. In the second programming cycle, S1 of high level makes write drive circuits W/D2 and W/D3 transfer two data bits, provided from data buffers DBF2 and DBF3, to their corresponding bit lines of two bits. In the third programming cycle, S2 of high level makes write drive circuits W/D4 and W/D5 transfer two data bits, provided from data buffers DBF4 and DBF5, to their corresponding bit lines of two bits. In the fourth programming cycle, S3 of high level makes write drive circuits W/D6 and W/D7 transfer two data bits, provided from data buffers DBF6 and DBF7, to their corresponding bit lines of two bits. In the fifth programming cycle, S4 of high level makes write drive circuits W/D8 and W/D9 transfer two data bits, provided from data buffers DBF8 and DBF9, to their corresponding bit lines of two bits. In the sixth programming cycle, S5 of high level makes write drive circuits W/D10 and W/D11 transfer two data bits, provided from data buffers DBF10 and DBF11, to their corresponding bit lines of two bits. In the seventh programming cycle, S6 of high level makes write drive circuits W/D12 and W/D13 transfer two data bits, provided from data buffers DBF12 and DBF13, to their corresponding bit lines of two bits. In the eighth programming cycle, S7 of high level makes write drive circuits W/D14 and W/D15 transfer two data bits, provided from data buffers DBF14 and DBF15, to their corresponding bit lines of two bits.

As described above, the programming unit of data bits can be modified in accordance with the level of a current power supply voltage. According to the preferred embodiments, a higher power supply voltage enables the 4-bit programming operation and a lower power supply voltage carries out the 2-bit programming operation. The invention provides an efficient program in a higher power supply voltage, ans also makes it possible to conduct programming even in a lower power supply voltage without additional charge pump circuits.

Although embodiment of the invention have been disclosed and described, it will be appreciate that other embodiments and modification of the invention are possible.

What is claimed is:

1. A nonvolatile memory device operable in a plurality of programming cycles, the device comprising:

a memory cell array formed of a plurality of memory cells connected to bit lines and word lines;

a plurality of data buffers for receiving a plurality of data bits;

a plurality of write drive circuits disposed between the memory cell array and the data buffers; and a circuit for generating a plurality of selection signals for controlling the write drive circuits, in response to a current level of a power supply voltage;

wherein the selection signals determines the number of data bits programmed in one of the programming cycles.

2. A nonvolatile memory device operable in a plurality of programming cycles, the device comprising:

a memory cell array formed of a plurality of memory cells connected to bit lines and word lines;

a plurality of data buffers for receiving a plurality of data bits, the data buffer corresponding the data bits;

a plurality of write drive circuits disposed between the memory cell array and the data buffers, the write drive circuits corresponding to the data buffers;

a detection circuit for generating a signal which responds a current level of a power supply voltage; and a circuit for generating a plurality of selection signals for controlling the write drive circuits, in response to the signal provided from the detection circuit;

wherein the selection signals determines the number of the write drive circuits activated in one of the programming cycle and the number of data bits in said one programming cycle are determined by the number of the write drive circuits selected in said one programming cycle.

3. The memory device of claim 2, wherein the detection circuit comprises a comparator to compare a first voltage based on the power supply voltage to a reference voltage, the detection circuit generating, as the signal responding to the current level of a power supply voltage, a first digital signal level when the first voltage is greater than the reference voltage, and a second digital signal level when the first voltage is less than the reference voltage.

4. The memory device of claim 3, the detection circuit further comprising a divider circuit to generate the first voltage, the divider circuit comprising a first resistor, a second resistor, and a current source connected in series between the power supply voltage and a ground voltage, the first voltage referenced at a node between the first and second resistors.

5. The memory device of claim 4, the detection circuit further comprising an enable circuit to operate the current source during program operations.

6. The memory device of claim 5, wherein the enable circuit comprises a gate to enable the current source when a chip enable signal and a program operation signal are both enabled.

7. The memory device of claim 4, the detection circuit further comprising an enable circuit that enables the detection circuit during program operations.

8. The memory device of claim 2, the circuit for generating a plurality of selection signals comprising a selection control circuit to double the number of programming cycles and halve the number of data bits programmed in each programming cycle when the current level of a power supply voltage is below a predetermined threshold.

9. A method of programming a nonvolatile memory device, the method comprising:

evaluating the power supply voltage level; and setting the number of data bits programmed per programming cycle according to power supply voltage level, such that for higher evaluated power supply voltage levels more data bits are programmed per programming cycle than for lower evaluated power supply voltage levels.

* * * * *